(12) United States Patent
Kim et al.

(10) Patent No.: US 7,408,220 B2
(45) Date of Patent: Aug. 5, 2008

(54) NON-VOLATILE MEMORY AND FABRICATING METHOD THEREOF

(75) Inventors: Jongoh Kim, Hsinchu (TW); Yider Wu, Taipei (TW); Kent-Kuohua Chang, Taipei (TW)

(73) Assignee: MACRONIX International Co., Ltd., Hsinchu (TW)

( * ) Notice: Subject to any disclaimer, the term of this patent is extended or adjusted under 35 U.S.C. 154(b) by 182 days.

(21) Appl. No.: 11/463,250

(22) Filed: Aug. 8, 2006

(65) Prior Publication Data

US 2007/0026609 A1 Feb. 1, 2007

Related U.S. Application Data

(62) Division of application No. 11/180,117, filed on Jul. 11, 2005, now Pat. No. 7,157,333.

(51) Int. Cl.
*H01L 29/788* (2006.01)
(52) U.S. Cl. .................. 257/315; 257/318; 257/321; 438/257; 438/264
(58) Field of Classification Search ................ None
See application file for complete search history.

(56) References Cited

U.S. PATENT DOCUMENTS 5,416,349 A * 5/1995 Bergemont ................ 257/316
5,589,413 A * 12/1996 Sung et al. ................ 438/261
6,689,658 B2 * 2/2004 Wu ............................ 438/257
6,723,604 B2 * 4/2004 Yuan et al. ................. 438/257

* cited by examiner

*Primary Examiner*—Zandra Smith
*Assistant Examiner*—Khanh B Duong
(74) *Attorney, Agent, or Firm*—J.C. Patents

(57) ABSTRACT

A method of fabricating a non-volatile memory is provided. A plurality of columns of isolation structures are formed on a substrate. A plurality of rows of stacked gate structures crossing over the isolation structures are formed on the substrate. A plurality of doping regions are formed in the substrate between two neighboring stacked gate structures. A plurality of stripes of spacers are formed on the sidewalls of stacked gate structures. A plurality of first dielectric layers are formed on a portion of the isolation structures adjacent to two rows of stacked gate structures. Also, one isolation structure is disposed between two neighboring first dielectric layers in the same row, while two neighboring rows comprising the first dielectric layer and the isolation structure are arranged in an interlacing manner. A plurality of first conductive layers are formed between two neighboring first dielectric layers in the same row.

7 Claims, 9 Drawing Sheets

US 7,408,220 B2

NON-VOLATILE MEMORY AND FABRICATING METHOD THEREOF

CROSS-REFERENCE TO RELATED APPLICATION

This application is a divisional application of, and claims the priority benefit of, U.S. application Ser. No. 11/180,117 filed on Jul. 11, 2005 now U.S. Pat. No. 7,157,333.

BACKGROUND OF THE INVENTION

1. Field of the Invention

The present invention relates to a memory device and fabricating method thereof. More particularly, the present invention relates to a non-volatile memory and fabricating method thereof.

2. Description of the Related Art

Non-volatile memory is a type of memory that allows writing, reading and erasing data for multiple times, and the stored data will be retained even after power supplied to the device is off. Furthermore, non-volatile memory also has the advantages of small size, fast access speed and low power consumption. In addition, data can be erased in a block-by-block fashion so that the operating speed is further enhanced. With these advantages, non-volatile memory has become one of the most widely adopted memory devices for personal computers and electronic equipments.

A typical non-volatile memory comprises an array of memory cells. The horizontally laid memory cells are serially connected through a word line and the vertically laid memory cells are serially connected through a bit line. In general, the control gate of the memory cell serves as the word line, while the source region or drain region of the memory is electrically connected with bit line through the source contact or the drain contact. However, in the process of forming such contacts, misalignment between the contacts and the source regions or the drain regions occurs easily, which would reduce device reliability. Although the misalignment can be corrected through an increased width of the source regions or the drain regions, the size of each device would be enlarged as well. Hence, in view of device integration, a better solution is desired.

SUMMARY OF THE INVENTION

Accordingly, at least one objective of the present invention is to provide a method of fabricating a non-volatile memory capable of resolving the misalignment problem in the conventional contact fabricating process.

At least a second objective of the present invention is to provide a non-volatile memory having a smaller device dimension so that overall level of integration of the memory can be increased.

To achieve these and other advantages and in accordance with the purpose of the invention, as embodied and broadly described herein, the invention provides a method of fabricating a non-volatile memory. First, a substrate is provided. A plurality of columns of isolation structures are formed on the substrate. Thereafter, a plurality of rows of stacked gate structures are formed on the substrate. The stacked gate structures cross over the isolation structures, and each stacked gate structure comprises a bottom dielectric layer, a charge storage layer, a top dielectric layer and a control gate layer sequentially disposed over the substrate. After that, a plurality of doping regions are formed in the substrate between two neighboring stacked gate structures. A plurality of stripes of spacers are formed on the sidewalls of stacked gate structures. A plurality of first dielectric layers are formed on a portion of the isolation structures between two neighboring rows of stacked gate structures. Wherein, one isolation structure is disposed between two neighboring first dielectric layers in the same row, while two neighboring rows comprising the first dielectric layer and the isolation structure are arranged in an interlacing manner. Then, a plurality of first conductive layers are formed between two neighboring first dielectric layers in the same row.

The present invention also provides a non-volatile memory. The non-volatile memory comprises a substrate, a plurality of columns of isolation structures, a plurality of rows of stacked gate structures, a plurality of stripes of spacers, a plurality of first dielectric layers, a plurality of first conductive layers and a plurality of doping regions. The isolation structures are located on the substrate. The stacked gate to structures are located on the substrate, and cross over the isolation structures. Also, each stacked gate structure comprises a bottom dielectric layer, a charge storage layer, a top dielectric layer and a control gate layer sequentially disposed over the substrate. The spacers are located on the sidewalls of the stacked gate structures. The first dielectric layers are located on a portion of the isolation structures adjacent to two rows of stacked gate structures. Also, one isolation structure is between two neighboring first dielectric layers in the same row, while two neighboring rows comprising the first dielectric layer and the isolation structure are arranged in an interlacing manner. The first conductive layers are located between two neighboring first dielectric layers in the same row, and between two spacers in opposite sides. The doping regions are located in the substrate beneath the first conductive layers.

Because contacts (the first conductive layers) are formed in the first dielectric layers on the isolation structures, misalignment between contacts and the source region or the drain region is minimized in the process of forming contacts, and the process window can be increased.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
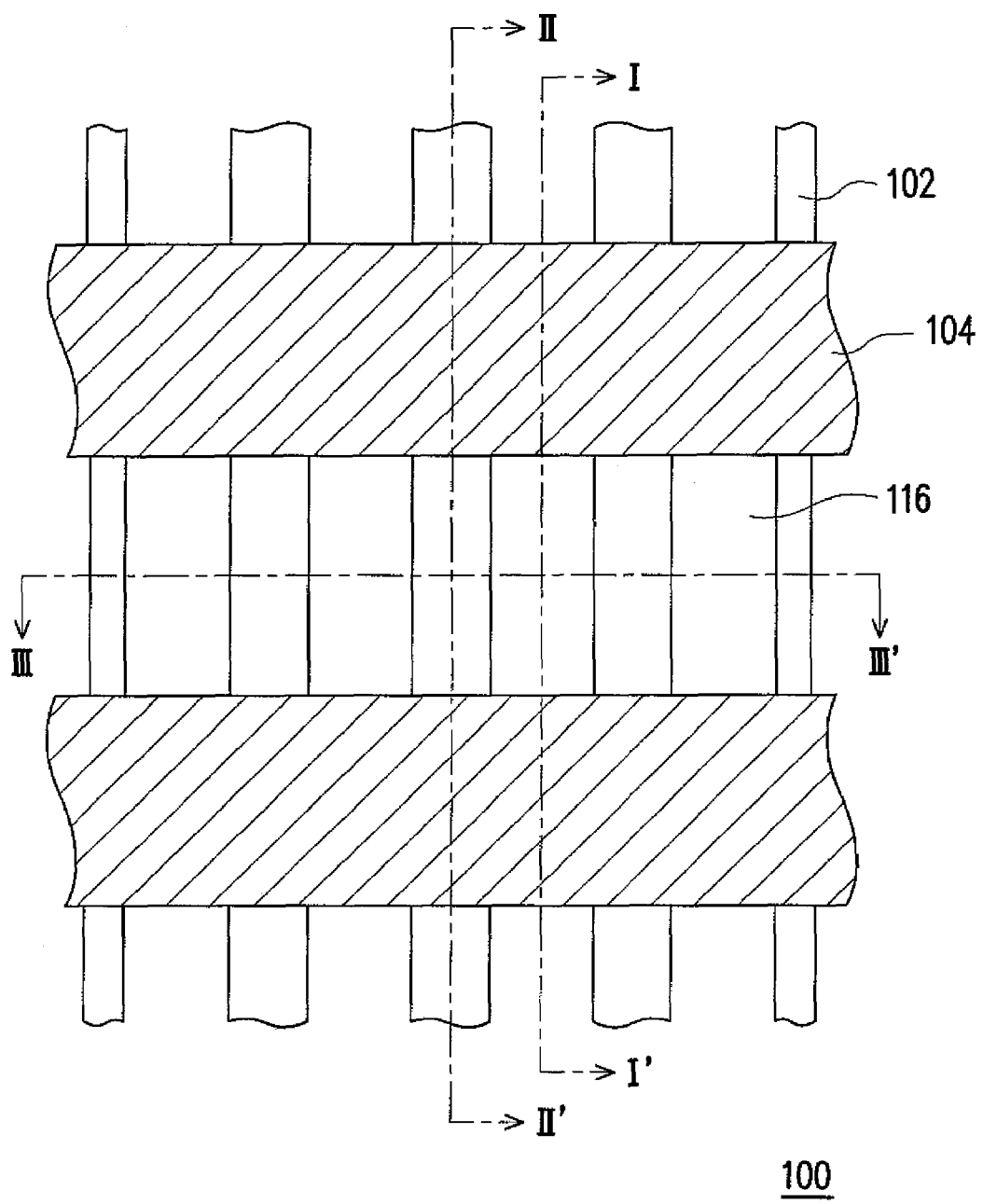
FIGS. 1A through 1C are top views showing the steps for fabricating a non-volatile memory according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 1B:
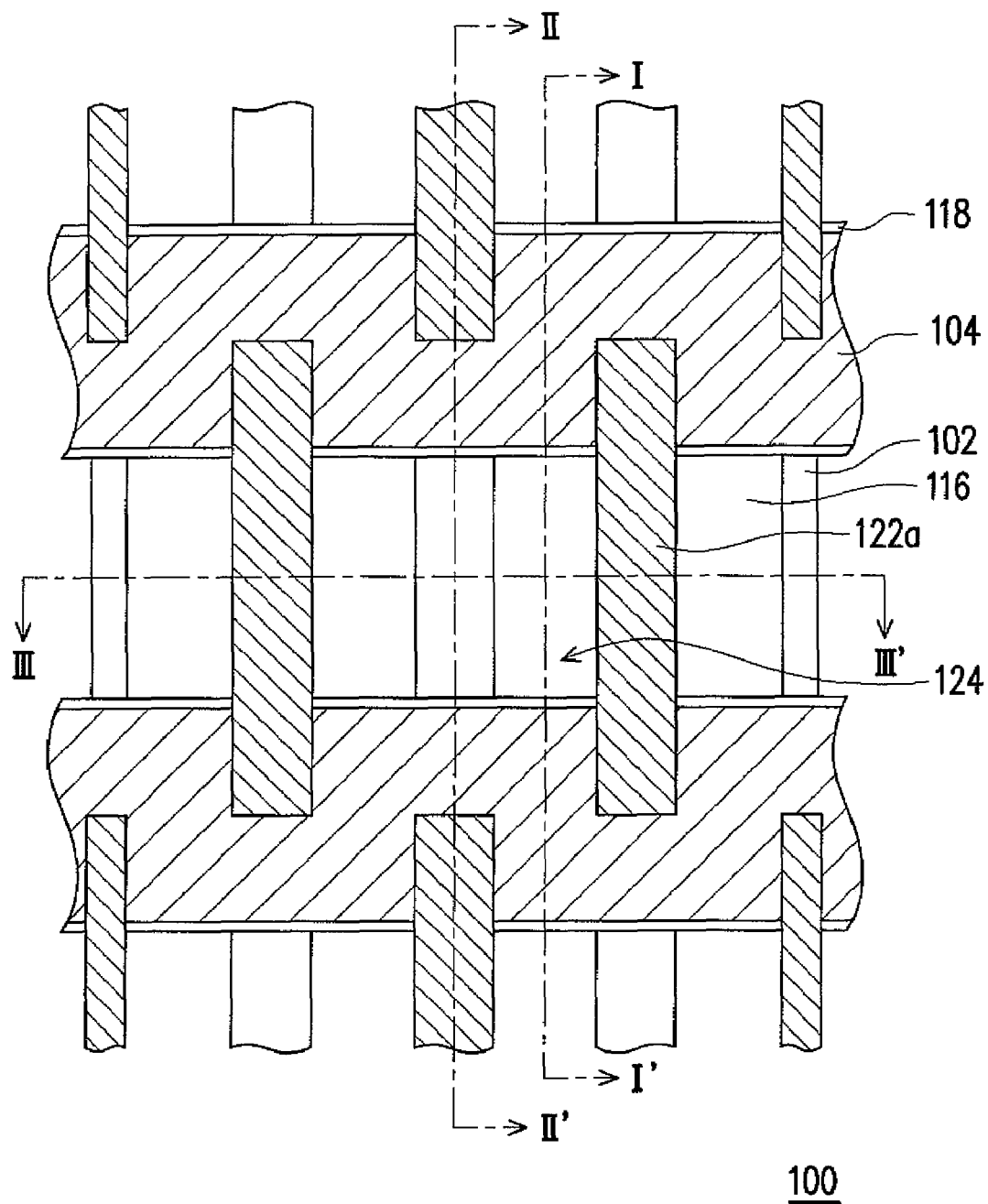
Figure 1C:
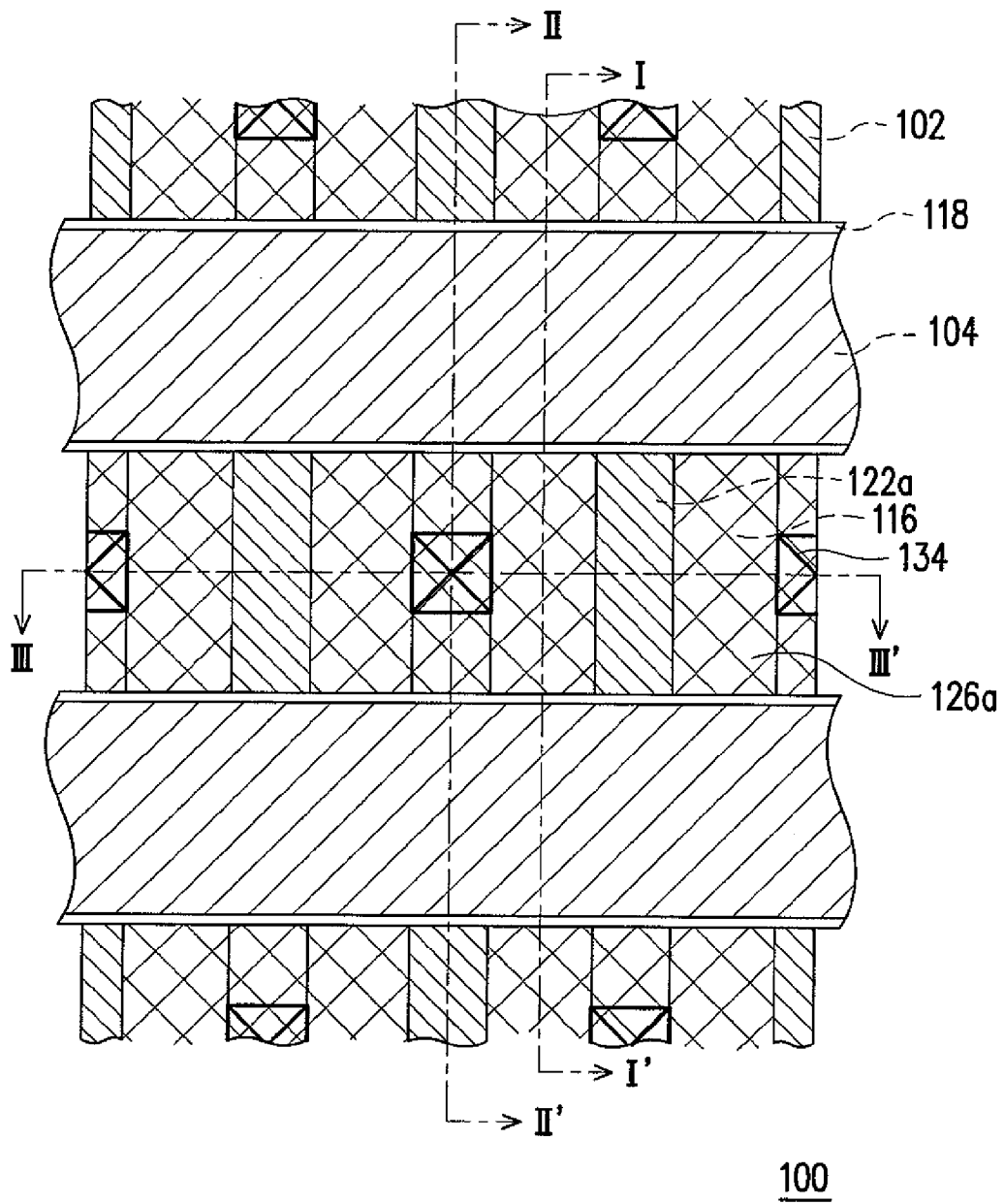

FIGS. 1A through 1C are top views showing the steps for fabricating a non-volatile memory according to one embodiment of the present invention; FIGS. 2A through 2D are schematic cross-sectional views along line I-I' of FIG. 1A; FIGS. 3A through 3D are schematic cross-sectional views along line II-II' of FIG. 1A; and FIGS. 4A through 4D are schematic cross-sectional views along line III-III' of FIG. 1A.

First, as shown in FIGS. 1A, 2A, 3A and 4A, a substrate 100 is provided. The substrate 100 can be a silicon substrate. Then, a plurality of columns of isolation structures 102 are formed on the substrate 100. Wherein, isolation structures 102 are shallow trench isolation structures, for example, which can be formed by performing a conventional shallow trench isolation structure fabricating process.

Thereafter, a plurality of rows of stacked gate structures 104 are formed on the substrate 100. Also, the stacked gate structures 104 cross over the isolation structures 102, and each stacked gate structure 104 comprises a bottom dielectric layer 106, a charge storage layer 108, a top dielectric layer 110 and a control gate layer 112 sequentially disposed over the substrate 100. Wherein, the stacked gate structures 104 are defined by a mask layer 114, while the control gate layer 112 can serve as a bit line. In an embodiment, the bottom dielectric layer 106 is a tunneling layer fabricated using silicon oxide material, for example. The charge storage layer 108 is a charge-trapping layer fabricated using silicon nitride material, for example. The top dielectric layer 110 is a charge barrier layer fabricated using silicon oxide material, for example. The control gate layer is a doped polysilicon layer, for example.

After that, a plurality of doping regions 116 are formed in the substrate 100 between two neighboring stacked gate structures 104. The doping regions 116 can serve as source regions and drain regions, which can be formed by performing an ion implantation process.

Figure 2A:
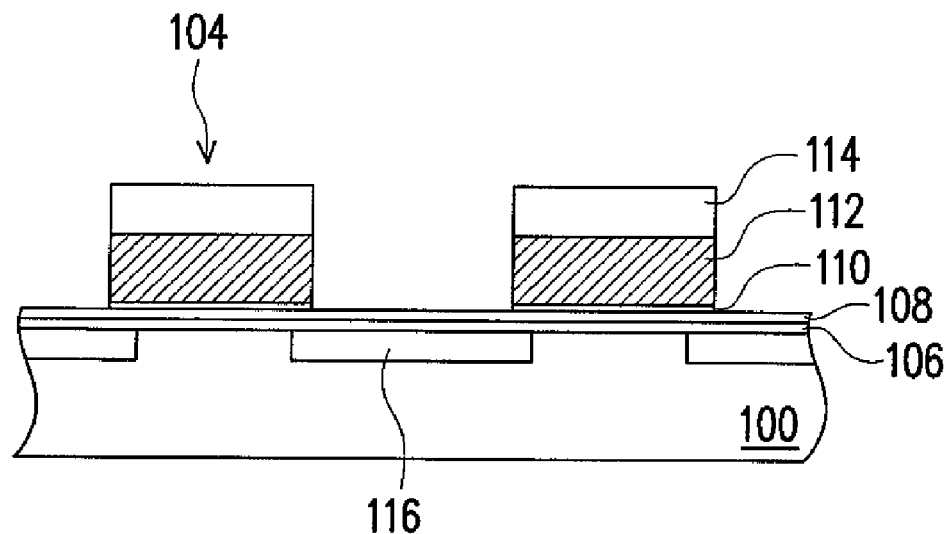
FIGS. 2A through 2D are schematic cross-sectional views along line I-I' of FIG. 1A showing the steps for fabricating a non-volatile memory.
Figure 2B:
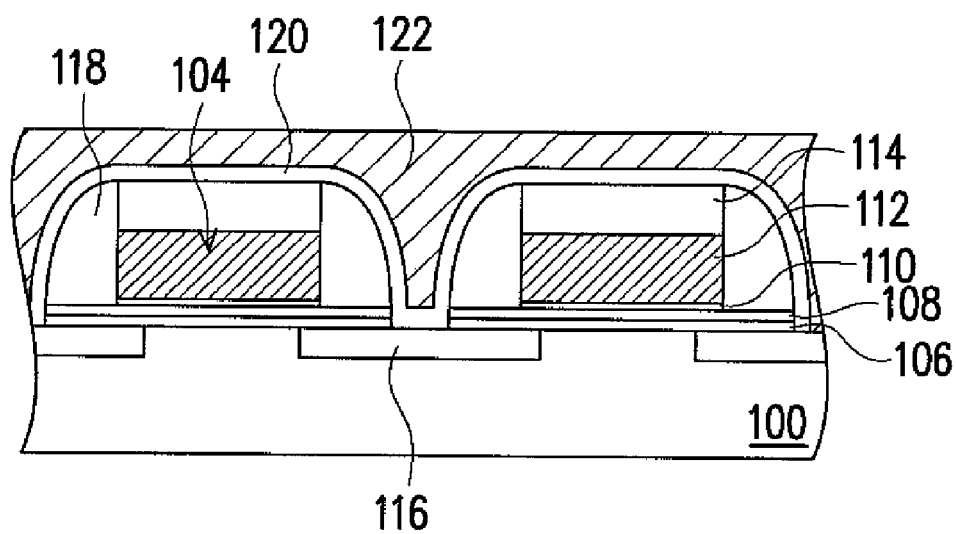
Figure 3A:
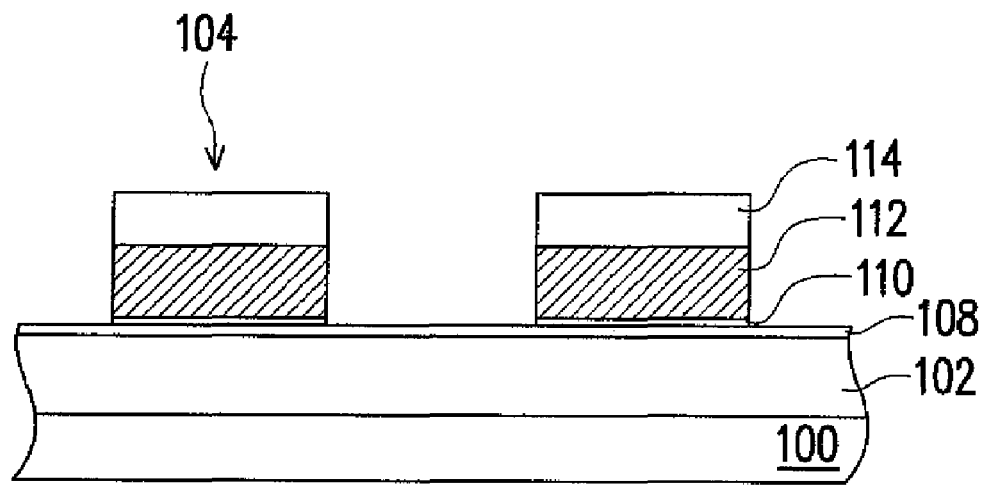
FIGS. 3A through 3D are schematic cross-sectional views along line II-II' of FIG. 1A showing the steps for fabricating a non-volatile memory.
Figure 3B:
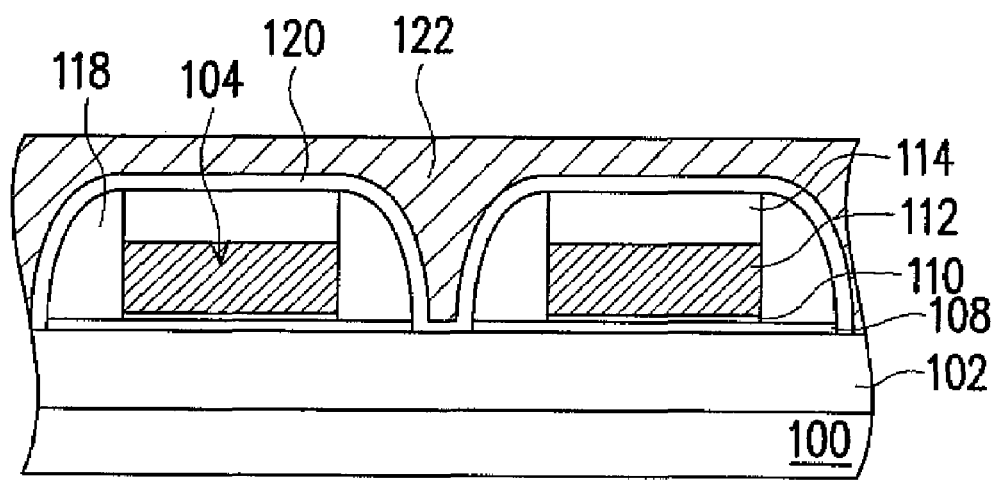
Figure 4A:
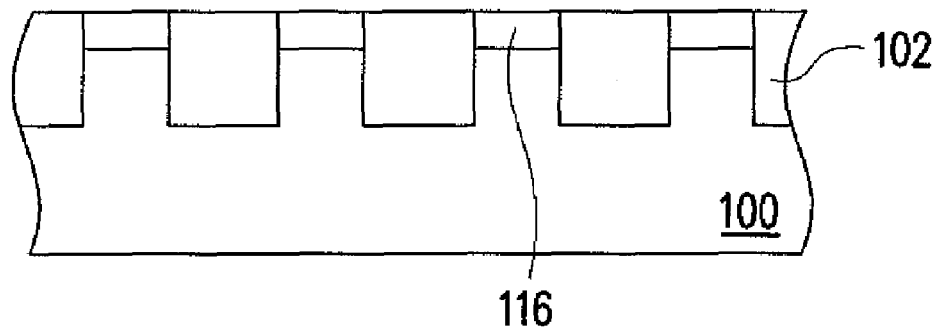
FIGS. 4A through 4D are schematic cross-sectional views along line III-III' of FIG. 1A showing the steps for fabricating a non-volatile memory.
Figure 4B:
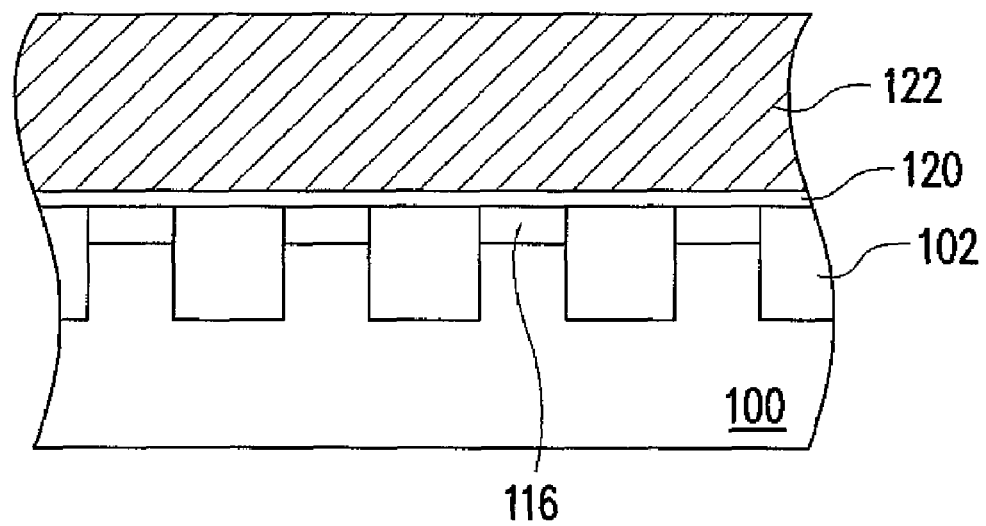

Then, as shown in FIGS. 2B, 3B and 4B, a plurality of stripes of spacers 118 are formed on the sidewalls of the stacked gate structures 104. The material of the spacers 118 can be, for example, silicon nitride, which can be fabricated by forming a spacer material layer over the substrate, and then performing an anisotropic etching process.

In an embodiment, after forming spacers 118, the method further comprises forming heavy doping regions in the substrate 100 by using the stacked gate structures 104 and the spacers 118 as a mask.

Thereafter, dielectric material layers 120 and 122 are sequentially formed over the substrate 100 to cover the stacked gate structures 104, isolation structures 102 and substrate 100. In addition, the etching selectivities of the dielectric material layers 120 and 122 are different, so that the dielectric material layer 120 can serve as an etching stop layer. In an embodiment, the material of the dielectric material layer 120 can be silicon nitride, while that of the dielectric material layer 122 can be silicon oxide, for example. In another embodiment, only the dielectric material layer 122 is formed, and the material of the dielectric material layer 122 can be silicon oxide.

Figure 2C:
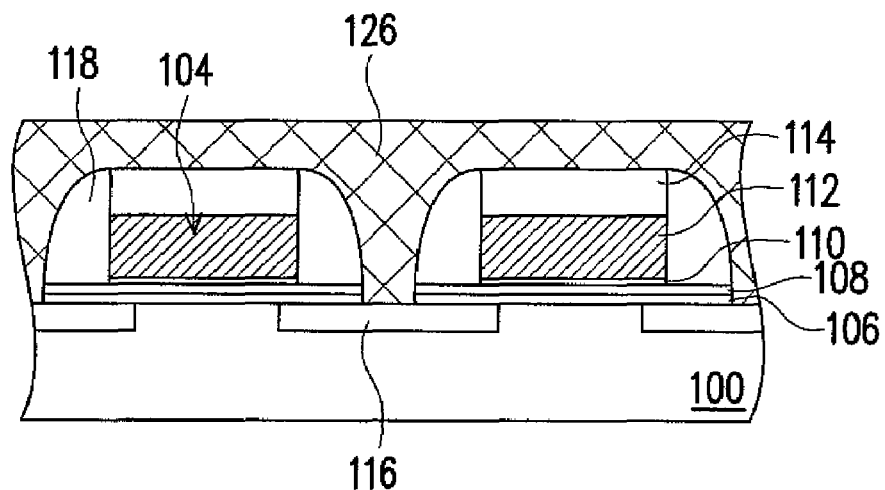
Figure 3C:
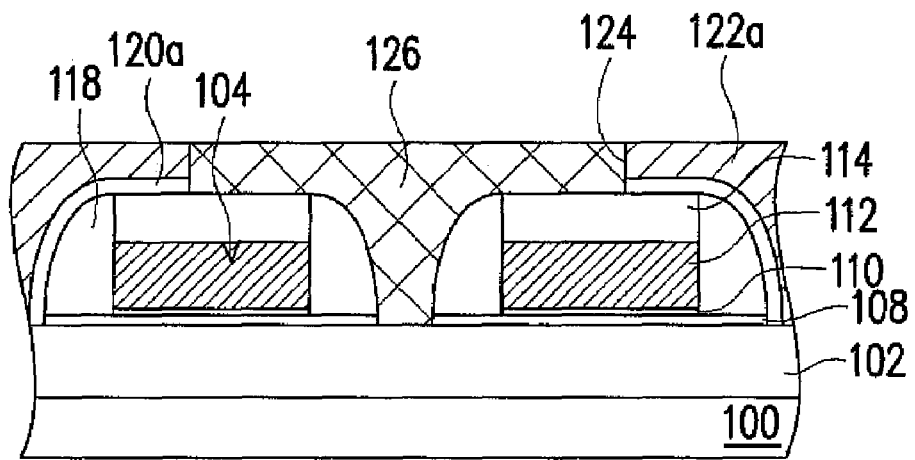
Figure 4C:
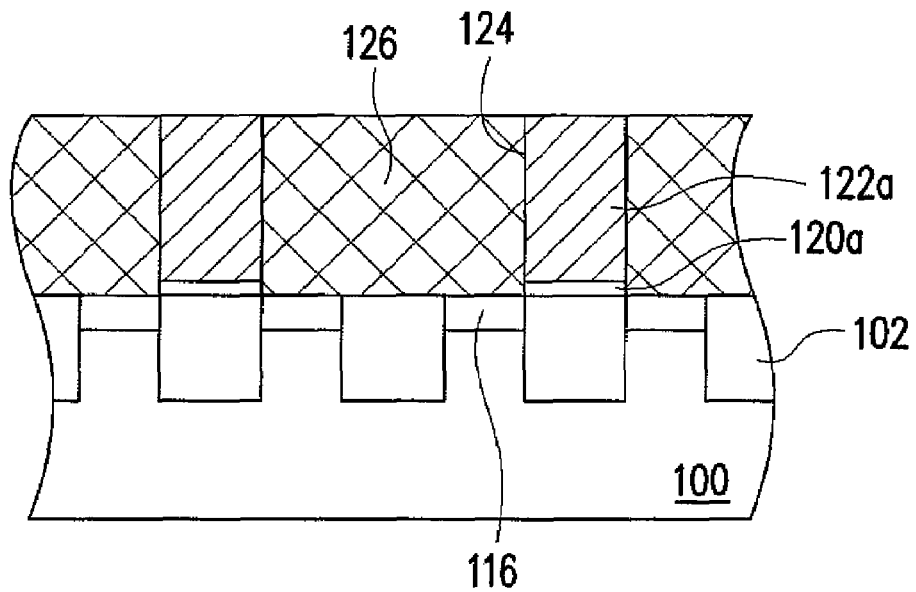

Then, as shown in FIGS. 2C, 3C and 4C, the dielectric material layers 120 and 122 are patterned to form dielectric layers 120a and 122a on a portion of the isolation structures 102 adjacent to two rows of stacked gate structures 104, and openings 124 are formed. Also, one isolation structure 102 is disposed between two neighboring dielectric layers 122a in the same row, while two neighboring rows comprising the dielectric layer 112a and isolation structure 102 are arranged in an interlacing manner (as shown in FIG. 1B). In addition, in an embodiment, the formed dielectric layers 120a and 122a extend in two sides to cover a portion of the stacked gate structure 104.

It is noted that self-aligned contact openings (openings 124) can be formed between two neighboring stacked gate structures 104 under the protection of the spacers 118. Therefore, misalignment of contact openings is minimized, and the process window can be increased.

Then, conductive layers 126 are formed between two neighboring dielectric layers 120a and 122a (in openings 124) in the same row. Wherein, the formed conductive layers 126 can be self-aligned contacts. The material of the conductive layers 126 can be tungsten, polysilicon, doped polysilicon, copper, aluminum, or other conductive material, for example, which can be made by forming a conductive material layer over the substrate 100 to cover the dielectric layers 120a and 122a, stacked gate structures 104 and substrate 100, and then removing the conductive material layer outside the opening 124 to expose the top surfaces of the dielectric layers 122a, wherein the removing method can be a chemical mechanical polishing process. At this time, the conductive material layer cover all of the substrate 100, and only the top surfaces of the dielectric layers 122a are exposed. In an embodiment, before forming the conductive layers 126, the method further comprises forming a conductive barrier layer to increase the adhesion of the conductive layers 126.

Figure 2D:
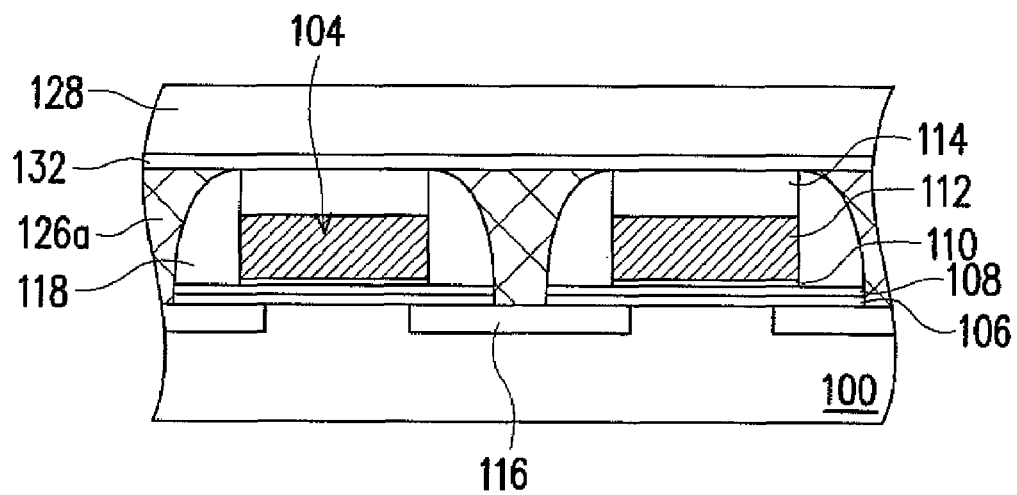
Figure 3D:
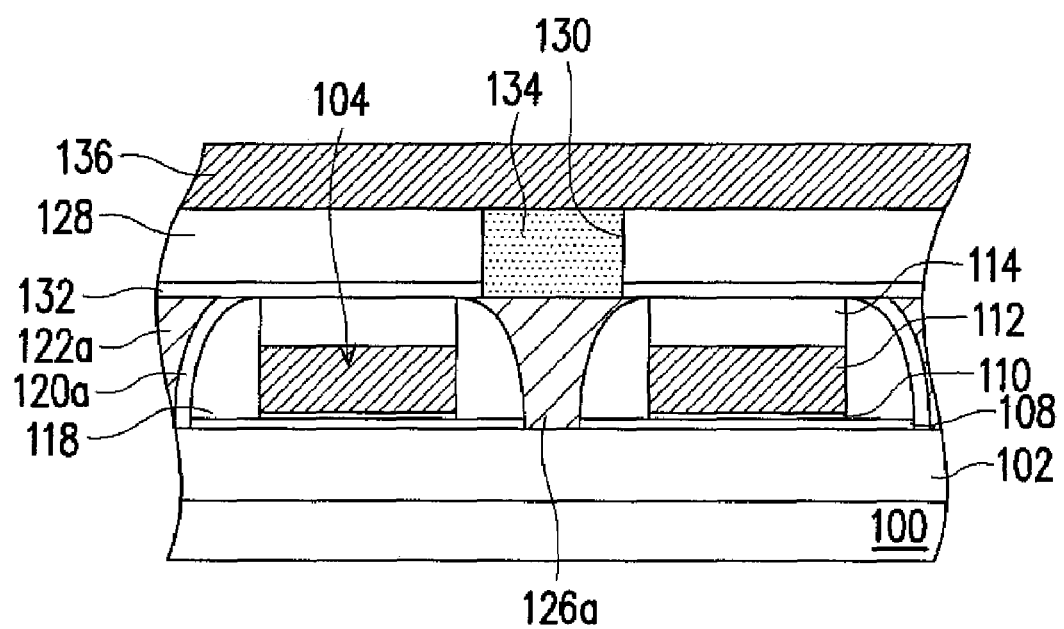
Figure 4D:
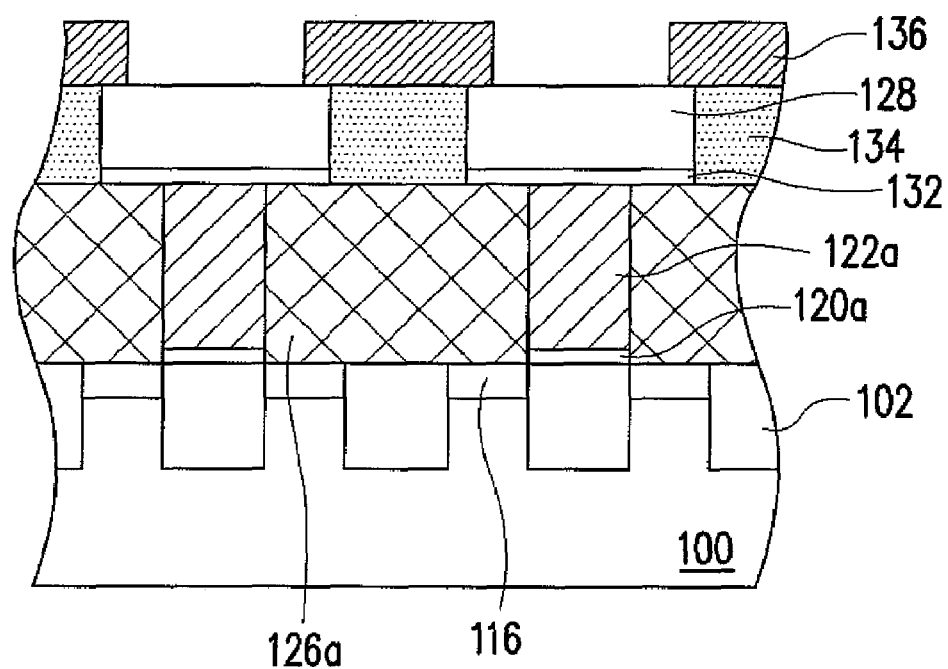

Thereafter, as shown in FIGS. 2D, 3D and 4D, a portion of the conductive layers 126, the dielectric layers 120a and 122a is removed on the stacked gate structures 104 to expose the top surfaces of the stacked gate structures 104. The removing method can be a chemical mechanical polishing process, for example.

After that, a dielectric layer 128 with a plurality of openings 130 is formed over the substrate 100 to cover the entire structure, and each opening 130 exposes a partial region of the conductive layer 126a. The material of the dielectric layer 128 can be, for example, silicon oxide. The dielectric layer 128 is made by forming a dielectric material layer over the substrate 100 to cover the entire structure, and then performing a patterning process to form the openings 130. It is noted that the size of the conductive layers 126a under the dielectric material layer is bigger, so that the process window is big during the patterning process to form openings 130, and thus misalignment can be avoided. In addition, in an embodiment, before forming the dielectric material layer, the method further comprises forming another dielectric layer 132 to serve as an etching stop layer.

Then, a plurality of conductive layers 134 are formed in the openings 130 (as shown in FIG. 1C). The conductive layers 134 can serve as contacts, and electrically connect with the conductive layers 126a. The material of the conductive layers 134 can be, for example, tungsten, polysilicon, doped polysilicon, copper, aluminum, or other conductive material and is formed by forming a conductive material layer over the substrate 100 to cover the entire structure, and then removing the conductive material layer outside the openings 130, wherein the removing method can be a chemical mechanical polishing process. In an embodiment, before forming the conductive layers 134, the method further comprises forming a conductive barrier layer to increase the adhesion of the conductive layers 134.

Thereafter, a plurality of columns of bit line 136 are formed on the dielectric layer 128, and each bit line 136 connects with the conductive layers 134 in the same column.

In the following, the structure fabricated in the above method is described. As shown in FIGS. 1C, 2D, 3D and 4D, the non-volatile memory comprises a substrate 100, a plurality of columns of isolation structures 102, a plurality of rows of stacked gate structures 104, a plurality of stripes of spacers 118, a plurality of dielectric layers 112a, a plurality of conductive layers 126a and a plurality of doping regions 116. In an embodiment, the non-volatile memory further comprises dielectric layers 120a and 128 and bit lines 136.

The isolation structures 102 are located on the substrate 100, and the isolation structures 102 can be shallow trench isolation structures. The stacked gate structures 104 are located on the substrate 100, and cross over the isolation structures 102. Also, each stacked gate structure 104 comprises a bottom dielectric layer 106, a charge storage layer 108, a top dielectric layer 110 and a control gate layer 112 sequentially disposed over the substrate 100.

The spacers 118 are located on the sidewalls of the stacked gate structures 104. The dielectric layers 122a are located on a portion of the isolation structures 102 between two neighboring rows of stacked gate structures 104. Also, one isolation structure 102 is disposed between two neighboring dielectric layers 122a in the same row, while two neighboring rows comprising the dielectric layer 112a and the isolation structure 102 are arranged in an interlacing manner.

The conductive layers 126a are located between two neighboring dielectric layers 122a in the same row. The material of the conductive layers 126a can be, for example, tungsten, polysilicon, doped polysilicon, copper, aluminum, or other conductive material. The doping regions 116 are located in the substrate 100 beneath the conductive layers 126a.

Each dielectric layer 120a is located between the dielectric layer 122a and the isolation structure 102, and between the dielectric layer 122a and spacer 118. The etching selectivities of the dielectric layers 120a and 122a are different. In an embodiment, the material of the dielectric layers 120a can be silicon nitride, while that of the dielectric layers 122a can be silicon oxide, for example.

The dielectric layer 128 with a plurality of openings 130 covers a portion of the conductive layers 126a, the dielectric layers 122a and the stacked gate structures 104, and each opening 130 exposes a partial region of the conductive layer 126a. The conductive layers 134 are located in the openings 130, wherein the material of the conductive layers 134 can be tungsten, polysilicon, doped polysilicon, copper, aluminum, or other conductive material. The bit lines 136 are located on the dielectric layer 128, and each bit line 136 connects with the conductive layers 134 in the same column.

Accordingly, in the present invention, self-aligned contacts can be formed between two neighboring stacked gate structures by the spacers 118 and the dielectric layers on the isolation structures. Therefore, misalignment of contacts is minimized, and the process window can be increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A non-volatile memory, comprising:
   a substrate;
   a plurality of columns of isolation structures located on the substrate;
   a plurality of rows of stacked gate structures located on the substrate and cross over the isolation structures, wherein each stacked gate structure comprises a bottom dielectric layer, a charge storage layer, a top dielectric layer and a control gate layer sequentially disposed over the substrate;
   a plurality of stripes of spacers located on the sidewalls of the stacked gate structures;
   a plurality of first dielectric layers located on a portion of the isolation structures adjacent to two rows of stacked gate structures, wherein one isolation structure is between two neighboring first dielectric layers in the same row, while two neighboring rows comprising the first dielectric layer and the isolation structure are arranged in an interfacing manner;
   a plurality of first conductive layers located between two neighboring first dielectric layers in the same row, and between two spacers in opposite direction; and
   a plurality of doping regions located in the substrate beneath the first conductive layers.

2. The structure according to claim 1, further comprising:
   a second dielectric layer with a plurality of openings covering a portion of the first conductive layers, the first dielectric layer and the stacked gate structure, wherein each opening exposes a partial region of the first conductive layer;
   a plurality of second conductive layers located in the opening; and
   a plurality of columns of bit lines located on the second dielectric layer, each bit line connecting with the second conductive layers in the same column.

3. The structure according to claim 2, wherein a material of the second conductive layers comprises tungsten, polysilicon, doped polysilicon copper or aluminum.

4. The structure according to claim 1, further comprising a third dielectric layer located between the first dielectric layer and the isolation structures.

5. The structure according to claim 4, wherein the etching selectivities of the first dielectric material layer and the second dielectric material layer are different.

6. The structure according to claim 1, wherein a material of the first conductive layers comprises tungsten, polysilicon, doped polysilicon copper or aluminum.

7. The structure according to claim 1, wherein the control gate layer serves as a bit line.

* * * * *